United States Patent [19]
Arai

[11] Patent Number: 5,825,048
[45] Date of Patent: Oct. 20, 1998

[54] SEMICONDUCTOR FUNCTIONAL DEVICE AND ELECTRONIC CIRCUIT PROVIDED WITH THE SAME

[75] Inventor: Kunihiro Arai, Isehara, Japan

[73] Assignee: Nippon Telegraph and Telephone Corporation, Tokyo, Japan

[21] Appl. No.: 667,722

[22] Filed: Jun. 21, 1996

[30] Foreign Application Priority Data

Jun. 21, 1995  [JP]  Japan ..................................... 7-154675

[51] Int. Cl.$^6$ .................................................. H01L 29/06
[52] U.S. Cl. ............................................ 257/25; 257/195
[58] Field of Search ................................. 257/25, 23, 26, 257/197, 194, 195

[56] References Cited

U.S. PATENT DOCUMENTS

| | | | |
|---|---|---|---|
| H1570 | 8/1996 | Lux et al. .................................. | 257/25 |
| 5,093,699 | 3/1992 | Weichold et al. ......................... | 357/22 |

FOREIGN PATENT DOCUMENTS

| | | |
|---|---|---|
| 1-265560 | 10/1989 | Japan . |
| 2-206170 | 8/1990 | Japan . |
| 3-198378 | 8/1991 | Japan . |
| 4-217367 | 8/1992 | Japan . |
| 7038079 | 2/1995 | Japan . |

OTHER PUBLICATIONS

S. Tehrani et al., "Resonant Interband Tunneling FET", *IEEE Electron Device Letters*, Dec. 1995, vol. 16, No. 12, pp. 557–559.

T. K. Woodward et al., "Integration of a Resonant–Tunneling Structure With a Metal–Semiconductor Field–Effect Transistor", *Appl. Phys. Lett. 51*, (19), Nov. 9, 1987, pp. 1542–1544.

A. R. Bonnefoi et al., "Inverted Base–Collector Tunnel Transistors", *Appl. Phys. Lett. 47*, (8), Oct. 15, 1985, pp. 888–890 and pp. 225–226.

A. R. Bonnefoi et al., "Resonant Tunneling Transistors With Controllable Negative Differential Resistances", *IEEE Electron Device Letters*, Dec. 1985, vol. EDL–6, No. 12, pp. 636–638.

K. Arai et al., "Proposal and Analysis of Resonant Tunnelling Diode With Single Peaked I–V Characteristics", *Electronics Letters*, Aug. 31, 1995, vol. 31, No. 18, pp. 1615–1616.

Kunihiro Arai et al., "A Novel Resonant Tunneling Diode with Single–Peak I–V Characterisitcs", *22nd Int. Symp. on Compound Semiconductors*, 1995, pp. 1–6.

Kunihiro Arai et al., "A Novel Resonant Tunneling Diode with Single Peaked I–V Characteristics", NTT LSI Labs. p. 1.

*Primary Examiner*—Sara W. Crane
*Attorney, Agent, or Firm*—Spencer & Frank

[57] ABSTRACT

A semiconductor functional device includes a semi-insulating semiconductor substrate; a resonant tunneling structure which includes, on the substrate, an n-type collector layer, an epitaxial multilayer structure including a double barrier structure constituted of a plurality of barrier layers holding a well layer therebetween, and an n-type emitter layer; an emitter electrode formed on the emitter layer; and a collector electrode formed on the collector layer. An undoped semiconductor barrier layer is interposed between the semi-insulating semiconductor substrate and the collector layer. With respect to a width of the emitter electrode, a thickness and an impurity concentration of the collector layer are selected such that the collector layer is pinched off when a potential difference generated between the emitter layer and the collector layer is equal to a valley voltage of I–V characteristics of the resonant tunneling structure constituted between the emitter layer and the collector layer while electrons travel from the emitter electrode toward the collector electrode through the emitter layer, the epitaxial multilayer structure and the collector layer. Consequently, the I–V characteristics have a single peak so as to satisfactorily suppress an increase in current if an applied voltage is higher than the valley voltage. Moreover, it is possible to achieve an electronic circuit provided with the semiconductor functional device having a large design margin and a large fabrication tolerance.

21 Claims, 11 Drawing Sheets

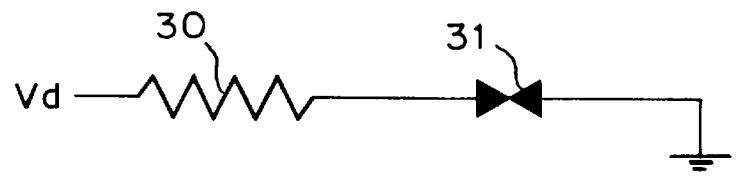
FIG. 3 (PRIOR ART)
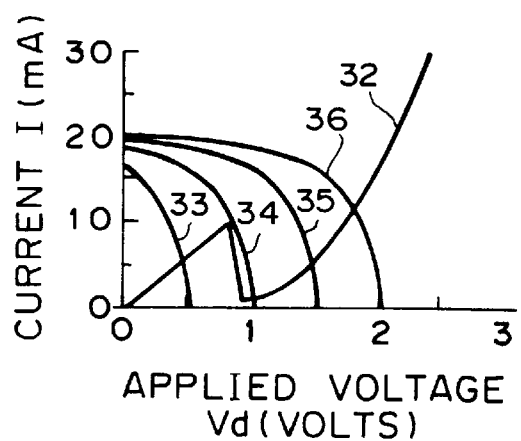 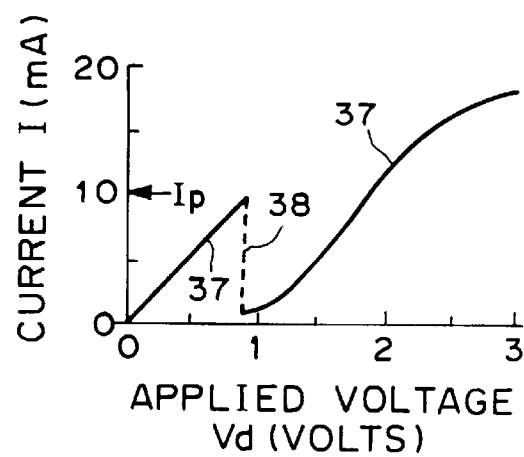
FIG. 4A
(PRIOR ART)
FIG. 4B
(PRIOR ART)

SEMICONDUCTOR FUNCTIONAL DEVICE AND ELECTRONIC CIRCUIT PROVIDED WITH THE SAME

BACKGROUND OF THE INVENTION

1. Field of the Invention

The present invention relates to a semiconductor device and, more particularly, to a semiconductor functional device having unique and special current/voltage characteristics (hereinafter referred to as "I–V characteristics"). Furthermore, the present invention relates to an electronic circuit provided with such a semiconductor device.

2. Description of the Related Art

FIG. 1 is a cross-sectional view showing a conventional InGaAs/AlAs-based resonant tunneling device; and Table 1 below describes particulars of the semiconductor epitaxial multilayer structure of the device.

TABLE 1

| LAYER No. | LAYER NAME | n-TYPE IMPURITY CONCENTRATION (/cm$^3$) | MATERIAL | THICKNESS (nm) |
|---|---|---|---|---|
| 10 | CAP | $1 \times 10^{19}$ | InGaAs | 30 |
| 9 | EMITTER | $1 \times 10^{18}$ | InGaAs | 120 |
| 8 | SPACER | UNDOPED | InGaAs | 1.4 |
| 7 | BARRIER | UNDOPED | AlAs | 2 |
| 6 | WELL | UNDOPED | InGaAs | 4.1 |
| 5 | BARRIER | UNDOPED | AlAs | 2 |
| 4 | SPACER | UNDOPED | InGaAs | 3 |
| 3 | COLLECTOR | $2 \times 10^{18}$ | InGaAs | 400 |
| 1 | SUBSTRATE | — | SEMI-INSULATING InP | — |

Referring to FIG. 1, ohmic contacts are established between an emitter electrode 11 and an n-type InGaAs layer 10 and between a collector electrode 12 and an n-type InGaAs layer 3, respectively. When the emitter electrode 11 is grounded to apply a positive voltage to the collector electrode 12, electrons travel from the emitter electrode 11 toward the collector electrode 12 through layers 10, 9, 8, 7, 6, 5 and 4 and then the n-type InGaAs layer 3, in which the electrons travel in the lateral direction. Absent proper designing of the layer 3, there will occur a drop of voltage in the InGaAs layer 3 in the lateral direction. The n-type InGaAs layer 3 is grown to have a sufficient thickness and a sufficient impurity concentration so that the lateral voltage drop in the n-type InGaAs layer 3 just under the emitter electrode 11 is decreased to a level which can be deemed substantially zero. The relationship between a current flowing in this conventional device and an applied voltage directly reflects I–V characteristics of the resonant tunneling structure comprising the layers 10, 9, 8, 7, 6, 5, 4 and 3, as illustrated in FIG. 2.

In FIG. 2, if the applied voltage is lower than a peak voltage Vp, the current is increased monotonically at an increasing voltage. If the applied voltage is not lower than the peak voltage Vp and lower than a valley voltage Vv, the current is decreased monotonically at an increasing voltage and exhibits a negative differential resistance. If the applied voltage is not lower than the valley voltage Vv, the current is monotonically increased at an increasing voltage. This is because the transmittance of electrons through the double barrier structure constituted of the layers 7, 6 and 5 is changed depending on the applied voltage by a resonance scattering effect of the double barrier structure as indicated by a curve in FIG. 2.

This conventional device is expected to be applicable to a circuit of low power consumption owing to I–V characteristics with a valley, as described above. The current is, however, increased in the case the applied voltage is varied from the valley voltage in this conventional device. Consequently, in an electronic circuit in which the valley voltage is taken as one operating point, if the operating point is shifted due to variations in supply voltage or fluctuation in characteristics of the device, the current is abruptly increased, thereby leading to an increase in power consumption. As a result, there arises a problem of limitation in respect to a design margin or a fabrication tolerance in fabricating such an electronic circuit.

FIG. 3 is a circuit diagram illustrating a conventional electronic circuit provided with a resistor 30 having a nonlinear resistance with current saturation and a conventional resonant tunneling device 31 connected in series to the resistor 30.

The operational principle of the conventional circuit will be explained hereunder. A current I flowing with application of an applied voltage Vd across the circuit is given at a point in which an I–V characteristic curve 32 of the resonant tunneling device 31 intersects a load curve representing the I–V characteristics of the resistor 30, as illustrated in FIG. 4A. For example, there are shown load curves 33, 34, 35 and 36 at applied voltages Vd of 0.5, 1.0, 1.5 and 2.0 V, respectively. FIG. 4B illustrates the results of calculation of currents in the conventional circuit as functions of the applied voltages. In FIG. 4B, a stable state is indicated by solid curves 37 while an unstable state is indicated by a dotted curve 38. The current is prominently increased at an applied voltage higher than a valley voltage. It is, therefore, found that a current higher than a peak current Ip flows with application of a sufficiently high voltage. Since the resistor 30 having a nonlinear resistance with current saturation is selected so as to have a low resistance in this example of calculation, the I–V characteristic curve of the resistor 30 almost accords with the I–V characteristic curve 32 of the resonant tunneling device 31 at an applied voltage of 2 V or lower.

FIGS. 5A and 5B illustrate the results of calculation of currents in the aforementioned circuit in the case in which the resistor 30 having a nonlinear resistance with current saturation has a lower saturation current value. In the same manner, the current is increased at an applied voltage higher than the valley voltage; a current higher than a peak current Ip flows with application of a sufficiently high applied voltage, although its degree is slightly lower than the case shown in FIG. 4B. Moreover, a bistable region appears in the applied voltage of the I–V characteristics.

FIGS. 6A and 6B illustrate the results of calculation of currents in the aforementioned circuit in the case in which the resistor 30 having a nonlinear resistance with current saturation has a still lower saturation current value. In this case, a conspicuously enlarged bistable region appears in the applied voltage. Although not indicated explicitly in these calculation results, a current higher than a peak current Ip flows also in this case if an applied voltage is sufficiently high.

As described above, according to the conventional circuit described above, the current is necessarily increased above the peak current Ip when the applied voltage is sufficiently high although an increase in current is somewhat suppressed at applied voltages higher than the valley voltage Vv. To make matters worse, there arises another problem in that a large bistable region appears in the case in which the resistor 30 having a nonlinear resistance with current saturation, in which the saturation current value is small, is used in order to more strongly suppress an increase in current.

The aforementioned problems could be solved by a semiconductor functional device in which an increase in current could be satisfactorily suppressed even at an applied voltage higher than a valley voltage. Up to the present, there has been developed no electronic device that has such I–V characteristics as far as the present inventor knows.

The prior art has experienced problems in that the current is abruptly increased above the peak current in the case in which the applied voltage is higher than the valley voltage, and in that the current is difficult to keep below the peak current even if an abrupt increase in current can be suppressed at applied voltages higher than the valley voltage. As a result, there has been an increasing demand for a semiconductor functional device and an electronic circuit provided with the same, in which the aforementioned problems can be solved.

SUMMARY OF THE INVENTION

An object of the present invention is to provide a semiconductor functional device in which the I–V characteristics have a single peak and an increase in current can be satisfactorily suppressed at an applied voltage higher than a valley voltage, so as to realize an electronic circuit provided with the semiconductor functional device having a large design margin and a large fabrication tolerance.

According to a first aspect, the present invention provides a semiconductor functional device which comprises:

a semi-insulating semiconductor substrate;

an undoped semiconductor barrier layer provided on the substrate;

a resonant tunneling structure provided on a main surface of the substrate, the resonant tunneling structure having:
  a part of an n-type collector layer provided on the barrier layer;
  an epitaxial multilayer structure provided on the part of the n-type collector, the epitaxial multilayer including a double barrier structure constituted of a plurality of barrier layers and at least one well layer inserted between any adjacent two of the plurality of barrier layers, and
  an n-type emitter layer provided on the epitaxial multilayer structure;

an emitter electrode provided on the emitter layer; and a collector electrode provided on the remaining part of the collector layer;

wherein for a given width of the emitter electrode, a thickness and an impurity concentration of the collector layer are selected such that the collector layer is pinched off, when a potential difference between the emitter layer and the collector layer established while electrons travel from the emitter electrode toward the collector electrode through the emitter layer, the epitaxial multilayer structure and the collector layer is equal to a valley voltage of I–V characteristics of the resonant tunneling structure.

Here, the collector layer may preferably have a thickness of not greater than 300 nm and an impurity concentration of not higher than $5 \times 10^{18}$ cm$^{-3}$ for a given width of the emitter electrode of not larger than 3 µm.

Preferably, the undoped semiconductor barrier layer consists of InAlAs, the collector layer may consist of InGaAs, the plurality of barrier layers consist of AlAs, the well layer inserted in any adjacent two of the barrier layers consists of InGaAs, and the emitter layer consists of InGaAs.

Preferably, the undoped semiconductor barrier layer consists of AlGaAs, the collector layer consists of GaAs, the plurality of barrier layers consist of AlAs, the well layer inserted in any adjacent two of the barrier layers consists of GaAs, and the emitter layer consists of GaAs.

The epitaxial multilayer structure including the double barrier structure may be not only formed just under the emitter electrode but also projected toward the collector electrode with a clearance therefrom.

The collector electrode may comprise first and second collector electrodes provided on one and the other sides, respectively, of the epitaxial multilayer structure with a clearance therefrom.

In a second aspect, the present invention provides a semiconductor functional device which comprises:

a semi-insulating semiconductor substrate;

a first undoped semiconductor barrier layer provided on said substrate;

an inverted high electron mobility transistor structure provided on said first undoped semiconductor barrier layer, having:
  an n-type semiconductor barrier layer provided on the first undoped semiconductor barrier layer,
  a second undoped semiconductor barrier layer provided on the n-type semiconductor barrier layer, and
  an undoped semiconductor channel layer provided on the second undoped semiconductor barrier layer;

a resonant tunneling structure, the resonant tunneling structure having:
  an epitaxial multilayer structure provided on the undoped semiconductor channel layer, having a double barrier structure constituted of a plurality of barrier layers and at least one well layer inserted between any adjacent two of the plurality of barrier layers;

an n-type emitter layer provided on the epitaxial multilayer structure;

an emitter electrode provided on the emitter layer; and a collector electrode provided on the undoped semiconductor channel layer; and wherein for a given width of the emitter electrode, a thickness and an impurity concentration of the n-type semiconductor barrier layer in the inverted high electron mobility transistor structure are selected such that the undoped semiconductor channel layer containing 2-dimensional electron gas in the inverted high electron mobility transistor structure is pinched off when a potential difference between the emitter layer and the undoped semiconductor channel layer containing the 2-dimensional electron gas in the inverted high electron mobility structure established while electrons travel from the emitter electrode toward the collector electrode through the emitter layer, the epitaxial multilayer structure and the undoped semiconductor channel layer containing the 2-dimensional electron gas in the inverted high electron mobility structure is equal to a valley voltage of I–V characteristics of the resonant tunneling structure constituted between the emitter layer and the undoped semiconductor channel layer containing the 2-dimensional electron gas in the inverted high electron mobility structure.

Here, the n-type semiconductor barrier layer in the inverted high electron mobility structure may preferably have a thickness of not greater than 300 nm and an impurity concentration of not higher than $5\times10^{18}$ cm$^{-3}$ for a width of the emitter electrode of not larger than 3 µm.

Preferably, the undoped semiconductor barrier layer consists of InAlAs, the n-type semiconductor barrier layer consists of InAlAs, the second undoped semiconductor barrier layer consists of InAlAs, and the undoped semiconductor layer in the inverted high electron mobility transistor structure consists of InGaAs, the plurality of barrier layers consist of AlAs, the at least one well layer inserted in any adjacent two of the barrier layers consists of InGaAs, and the emitter layer consists of InGaAs.

Preferably, the undoped semiconductor barrier layer consists of AlGaAs, the n-type semiconductor barrier layer consists of AlGaAs, the second undoped semiconductor barrier layer consists of AlGaAs, and the undoped semiconductor channel layer in the inverted high electron mobility transistor structure consists of GaAs, the plurality of barrier layers consist of AlAs, the at least one well layer inserted in any adjacent two of the barrier layers consists of GaAs, and the emitter layer consists of GaAs.

The epitaxial multilayer structure including the double barrier structure may be not only formed just under the emitter electrode but also projected toward the collector electrode with a clearance therefrom.

The collector electrode may comprise first and second collector electrodes provided on one and the other sides, respectively, of the epitaxial multilayer structure with a clearance therefrom.

In a third aspect, the present invention provides an electronic circuit comprising the semiconductor functional device of the present invention.

According to the present invention it is possible to provide a semiconductor functional device having single peak I–V characteristics, in which an increase in current can be satisfactorily suppressed at an applied voltage above a valley voltage. Application of the semiconductor functional device according to the present invention to an electronic circuit can reduce power consumption, enlarge the design margin and enhance the fabrication tolerance.

The above and other objects, effects, features and advantages of the present invention will become more apparent from the following description of embodiments thereof taken in conjunction with the accompanying drawings.

BRIEF DESCRIPTION OF THE DRAWINGS

FIG. 3 is a circuit diagram illustrating an electronic circuit provided with the conventional resonant tunneling device;

FIGS. 4A and 4B are graphs illustrating the I–V characteristics of the conventional circuit;

DETAILED DESCRIPTION OF PREFERRED EMBODIMENTS

Figure 7:
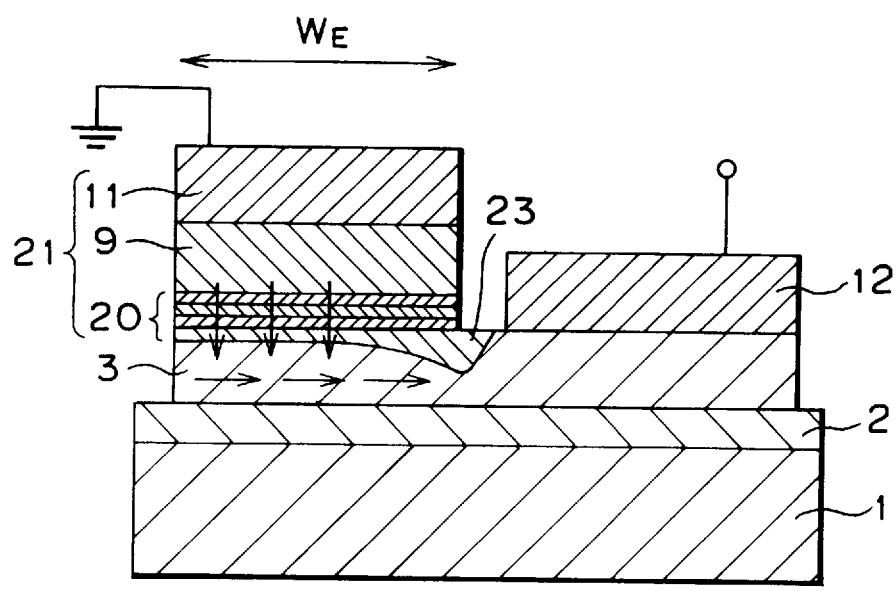
FIG. 7 is a cross-sectional view schematically showing a semiconductor functional device according to the present invention.

FIG. 7 is a cross-sectional view schematically showing a semiconductor functional device according to the present invention.

In FIG. 7, an undoped semiconductor barrier layer 2 is epitaxially grown on a semi-insulating semiconductor substrate 1. On the barrier layer 2 are epitaxially grown in order a collector layer 3 and an emitter unit 21. The emitter unit 21 includes a double barrier structure 20, an emitter layer 9 and an emitter electrode 11. A collector electrode 12 is formed on the collector layer 3 in a region in which the emitter unit 21 is not formed.

When the emitter electrode 11 is grounded and a positive voltage is applied to the collector electrode 12, there appears a depletion layer 23, which extends to a region between the emitter unit 21 and the collector electrode 12. The higher the voltage applied to the collector electrode 12, the larger the maximum width of the depletion layer 23.

According to the present invention, interposition of the barrier layer (e.g., an undoped InAlAs layer) 2 between the substrate 1 and the collector layer (e.g., an n-type InGaAs layer) 3 ensures a barrier which prevents injection of electrons from the collector layer 3 into the substrate 1. This reliably confines the electrons inside the collector layer 3 to thereby enhance a pinch-off effect of the depletion layer 23 with respect to the electrons traveling inside the collector layer 3 in the lateral direction as indicated by arrows. Consequently, it is possible to satisfactorily suppress an increase in current with application of a voltage higher than the saturation voltage, described later, so that a semiconductor functional device having single peak I–V characteristics can be realized with ease.

Next, requirements for the thickness and impurity concentration of the collector layer 3 in accordance with the width of the emitter electrode 11 will be conceptually described hereunder.

The explanation hereunder will be focused on a portion of the collector layer 3 which exists just under the emitter electrode 11 since that portion is most important in explaining the effects of the present invention. Namely, although the layer 3 is actually formed not only just under the emitter electrode 11 but also under the collector electrode 12, an explanation concerning on only the portion just under the emitter electrode 11 will suffice since the resistance in the other portions of the layer 3 is so low that the voltage drop in the other portions of the collector layer 3 can be deemed substantially zero, i.e., the potential can be deemed to be constant.

In the present invention, unlike the prior art, the resistance of the collector layer 3 is set such that a certain voltage drop can occur. Consequently, when the emitter electrode 11 is grounded and a positive voltage is applied to the collector electrode 12, a lateral electric field, i.e., a potential distribution, is generated in the collector layer 3 in the lateral direction or in the direction parallel to a main surface of the substrate. A channel opening for the current flowing in the lateral direction in the collector layer 3 in each lateral position depends on the potential of the layer 3 in each lateral position of the layer 3. Here, the term "potential" means a potential with respect to the grounded emitter electrode 11. The channel opening is monotonically depleted as the potential is increased. Since this potential is monotonically increased in the direction of from the emitter electrode 11 toward the collector electrode 12, the channel opening is depleted to a minimum at its end near the collector electrode 12 just under the emitter electrode 11. Here, the term "monotonically decreased" or "monotonically increased" means "decreased in such a manner that there occurs no increase" or "increased in such a manner that there occurs no decrease."

Referring to FIG. 7, the influence of the thickness and impurity concentration of the collector layer 3 upon the I–V characteristics of the device for a given width of the emitter electrode will be explained on three cases A, B and C.

Case A where the collector layer 3 has a sufficiently small thickness and a sufficiently low impurity concentration:

As the voltage applied to the collector electrode is gradually increased from 0 V while the emitter electrode is grounded, a current flows between the emitter electrode and the collector electrode. The current increases monotonically in accordance with the applied voltage when the voltage is sufficiently low. When the applied voltage is increased further, there will appear a voltage beyond which no further increase in the current occurs at increased applied voltages. This is because the channel opening is depleted to the lowermost limit, i.e., pinched off at the end of the collector layer 3 near the collector electrode 12 just under the emitter electrode 11. This marginal voltage is termed a "saturation voltage." Because the collector layer 3 has a sufficiently small thickness and a sufficiently low impurity concentration, the current at this instance is sufficiently low. Consequently, a potential difference between the emitter layer 9 and the layer 3 is smaller than the peak voltage Vp of the resonant tunneling structure, which includes the emitter layer 9, the double barrier structure 20, and the collector layer 3. Thus, the negative differential resistance of the resonant tunneling structure in this case does not affect the I–V characteristics of the semiconductor functional device in a substantial manner. Namely, the I–V characteristics of the device are those of a nonlinear resistor with current saturation, in which the current is constant independently of the applied voltage above a certain value although first the current is monotonically increased at an increasing applied voltage.

Figure 2:
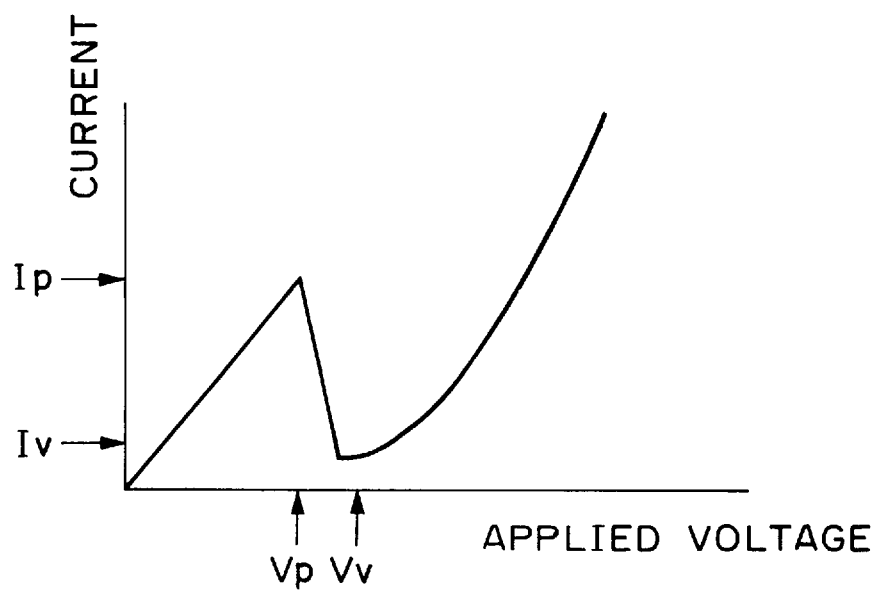
FIG. 2 is a graph illustrating the characteristics of the conventional resonant tunneling device.
Figure 5A:
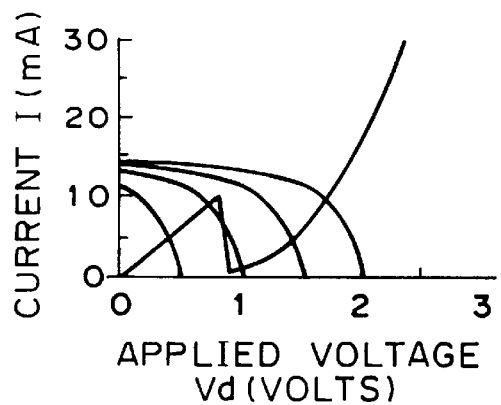
FIGS. 5A and 5B are graphs illustrating the I–V characteristics of the conventional circuit.
Figure 5B:
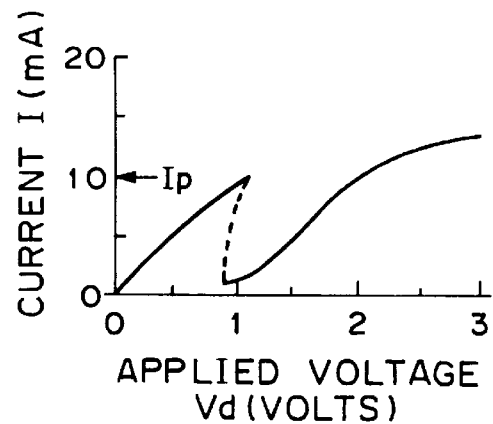
Figure 6A:
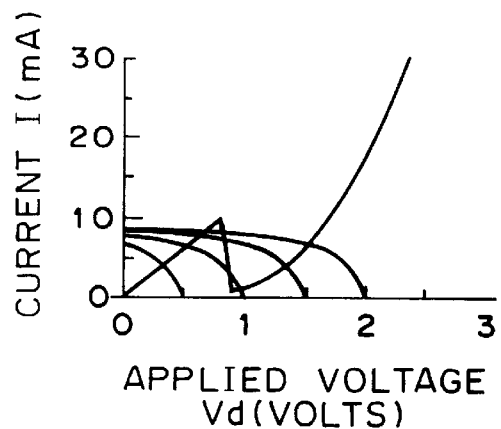
FIGS. 6A and 6B are graphs illustrating the I–V characteristics of the conventional circuit.
Figure 6B:
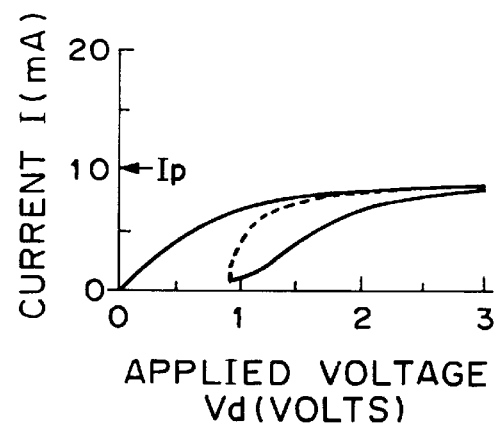

Case B where the collector layer 3 has a sufficiently large thickness and a sufficiently high impurity concentration:

This case B is close to the prior art, and therefore, the I–V characteristics of the semiconductor functional device are similar to those illustrated in FIG. 2. Namely, as the applied voltage is increased, the current is monotonically increased after it passes a maximum value and a minimum value in this order. This is because the collector layer 3 has a sufficiently great thickness and a sufficiently high impurity concentration and, hence, the collector layer 3 cannot be pinched off even if the potential difference between the layers 10 and 3 exceeds the valley voltage of the resonant tunneling structure, which includes the layers 9, 20, and 3. However, the collector layer 3 is finally pinched off at a certain applied voltage, and the current is hardly increased even if a voltage above that applied voltage is applied. Thus, the I–V characteristics of the semiconductor functional device in this case are as follows. That is, as the applied voltage is increased, first the current is monotonically increased up to the maximum value, is monotonically decreased down to the minimum value, is monotonically increased again above the minimum value until it finally reaches a constant value.

Figure 8:
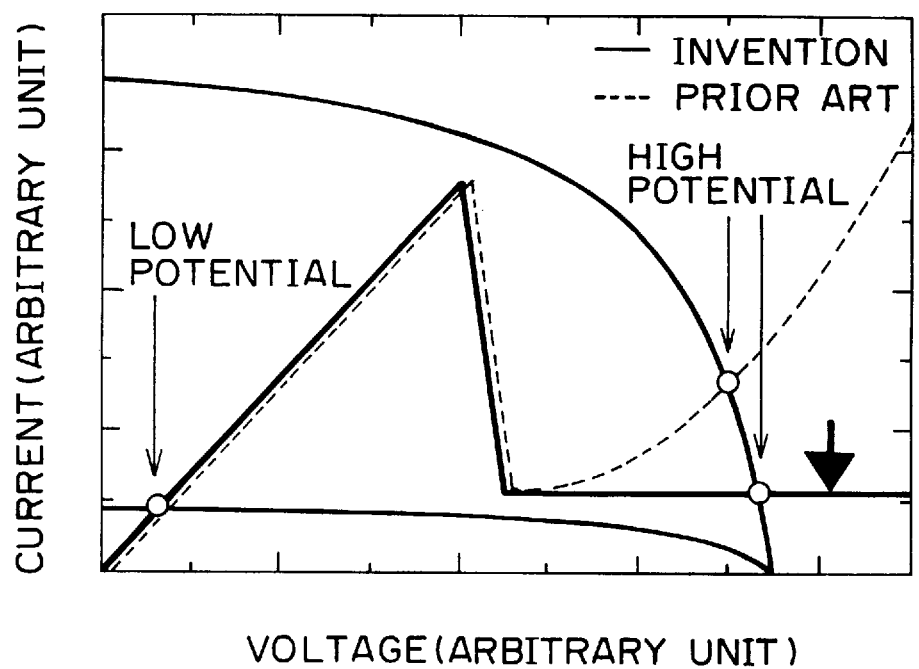
FIG. 8 is a graph illustrating the I–V characteristics of the semiconductor functional device according to the present invention in comparison with those of the conventional device.

Case C where the collector layer 3 has a thickness and an impurity concentration ranging from those in Case A to those in Case B:

Case C takes the I–V characteristics as follows: as the applied voltage is increased, first the current is monotonically increased up to the maximum value, is monotonically decreased down to the minimum value, and finally remains at a level which can be deemed substantially the same as the minimum value though with a slight increase. That is, it is possible to realize a semiconductor functional device having single peak I–V characteristics. (See FIG. 8)

It can be inferred from the above description that single peak I–V characteristics of the device can be achieved when for a given width of the emitter electrode, the thickness and impurity concentration of the collector layer 3 meet the requirements of Case C. If the width of the emitter electrode is varied, the thickness and impurity concentration of the collector layer 3 satisfying the above requirements are varied accordingly, although the basic concept is the same.

In the case in which an n-type InGaAs layer is used as the collector layer 3, the thickness and impurity concentration of the n-type InGaAs layer 3 that realize single peak I–V characteristics of the device are specifically given based on detailed calculation. An example of the calculation of the I–V characteristics of the semiconductor functional device according to the present invention will be illustrated hereunder. The calculation is carried out on the basis of a one-dimensional distributed parameter model in consideration of both a resonant tunneling current flowing vertically in the resonant tunneling structure and a current flowing laterally in the n-type InGaAs layer 3. Parameters used are given in Table 2, in which a P/V ratio denotes a ratio of a peak current to a valley current.

TABLE 2

Figure 9A:
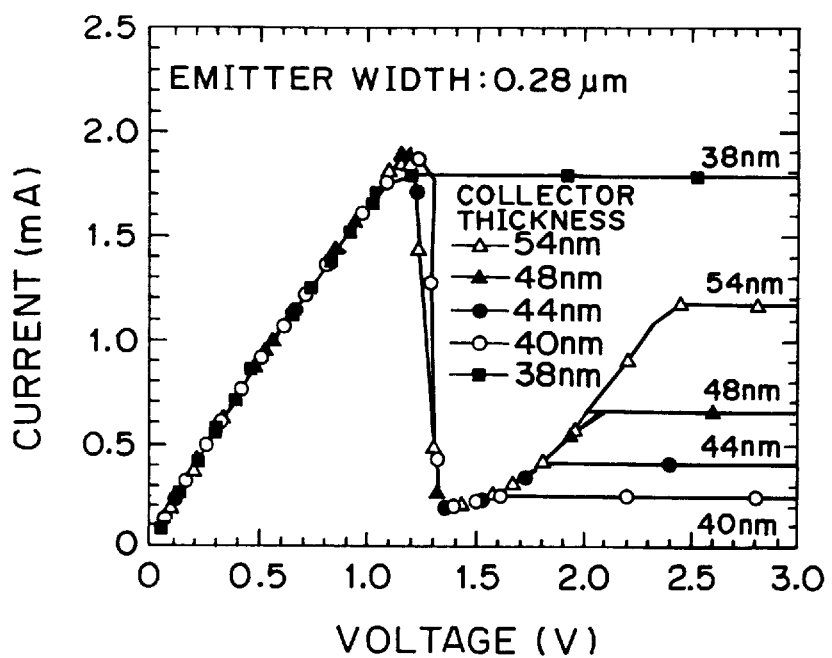
FIGS. 9A and 9B are graphs illustrating calculation results of the I–V characteristics of the semiconductor functional device according to the present invention.
Figure 9B:
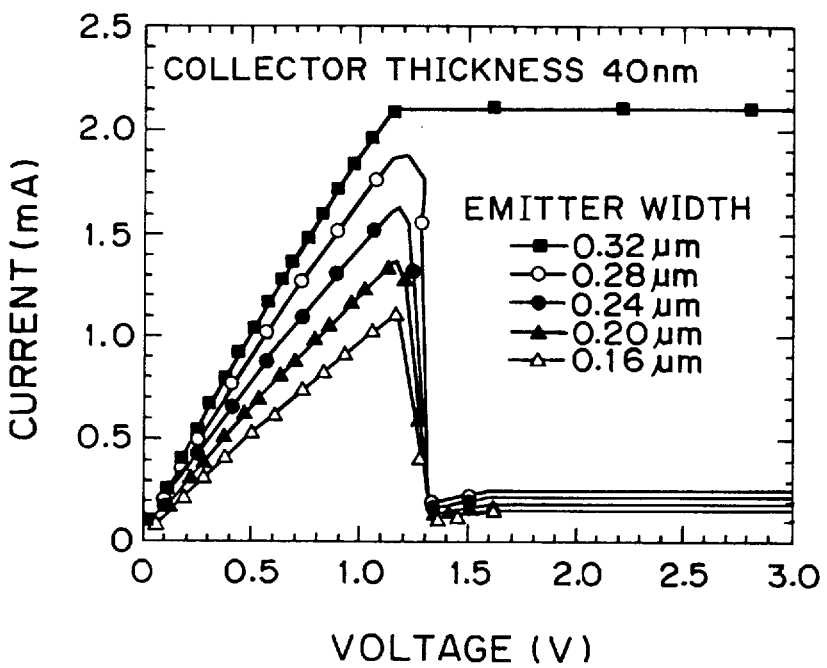

| LAYER | CHARACTERISTICS | FIG. 9A | FIG. 9B |
|---|---|---|---|
| n-TYPE InGaAs LAYER 3 (COLLECTOR) | THICKNESS | 38–54 nm | 40 nm |
| | IMPURITY CONCENTRATION | | $1 \times 10^{18}/cm^3$ |
| | ELECTRON MOBILITY | | 5000 $cm^3$/V/s |
| | SATURATED ELECTRON VELOCITY | | 2E7 cm/s |
| n-TYPE InGaAs LAYERS 9, 10 (EMITTER) | WIDTH OF EMITTER ELECTRODE 11 | 0.28 µm | 0.16–0.32 µm |
| RESONANT TUNNELING STRUCTURE | PEAK CURRENT DENSITY | | $7 \times 10^4$ A/$cm^2$ |
| | PEAK VOLTAGE | | 0.8 V |
| | VALLEY VOLTAGE | | 0.9 V |
| | P/V RATIO | | 10 |

FIG. 9A graphically shows the I–V characteristics of the semiconductor functional device according to the present invention in the case in which the width of the emitter electrode 11 is set to 0.28 µm and the impurity concentration of the n-type InGaAs collector layer 3 is set to $1 \times 10^{18}/cm^3$. It can be seen from the graph illustrated in FIG. 9A that excellent single peak characteristics can be achieved in the case in which the thickness of the n-type InGaAs layer 3 ranges from 40 nm to 44 nm. The case where the thickness of the collector layer 3 exceeds 44 nm corresponds to Case B described above, in which excellent single peak characteristics cannot be achieved. Meanwhile, the case where the thickness of the collector layer 3 is smaller than 40 nm corresponds to Case A described above, in which the semiconductor functional device has no single peak characteristics but has the same characteristics as those of a nonlinear resistor with current saturation.

FIG. 9B is a graph illustrating the I–V characteristics of the semiconductor functional device according to the present invention, in which the thickness and impurity concentration of the n-type InGaAs collector layer 3 are set to 40 nm and $1 \times 10^{18}/cm^3$, respectively, and the width of the emitter electrode 11 is used as a parameter. It is inferred from the graph illustrated in FIG. 9B that the device has excellent single peak characteristics over a wide range as long as the width of the emitter electrode 11 is not greater than 0.28 µm. The case where the width of the emitter electrode 11 is 0.32 µm corresponds to Case A described above, in which the device has no single peak characteristics but has the same characteristics as those of a nonlinear resistor with current saturation.

In the example illustrated in FIGS. 9A and 9B, the case where the collector layer 3 has a thickness of 40 nm and an impurity concentration of $1 \times 10^{18}/cm^3$ for a width of the emitter electrode 11 of not greater than 0.28 µm implies that the collector layer is pinched off in a state that the potential difference between the emitter layer and the collector layer is almost equal to the valley voltage of the I–V characteristics of the resonant tunneling structure constituted between the emitter layer and the collector layer. Because of this, the I–V characteristics of the device have a single peak, and an increase in current can be fully suppressed when the applied voltage is higher than the valley voltage. Therefore, it is possible to achieve an electronic circuit provided with the semiconductor functional device having a large design margin and a large fabrication tolerance.

Figure 10A:
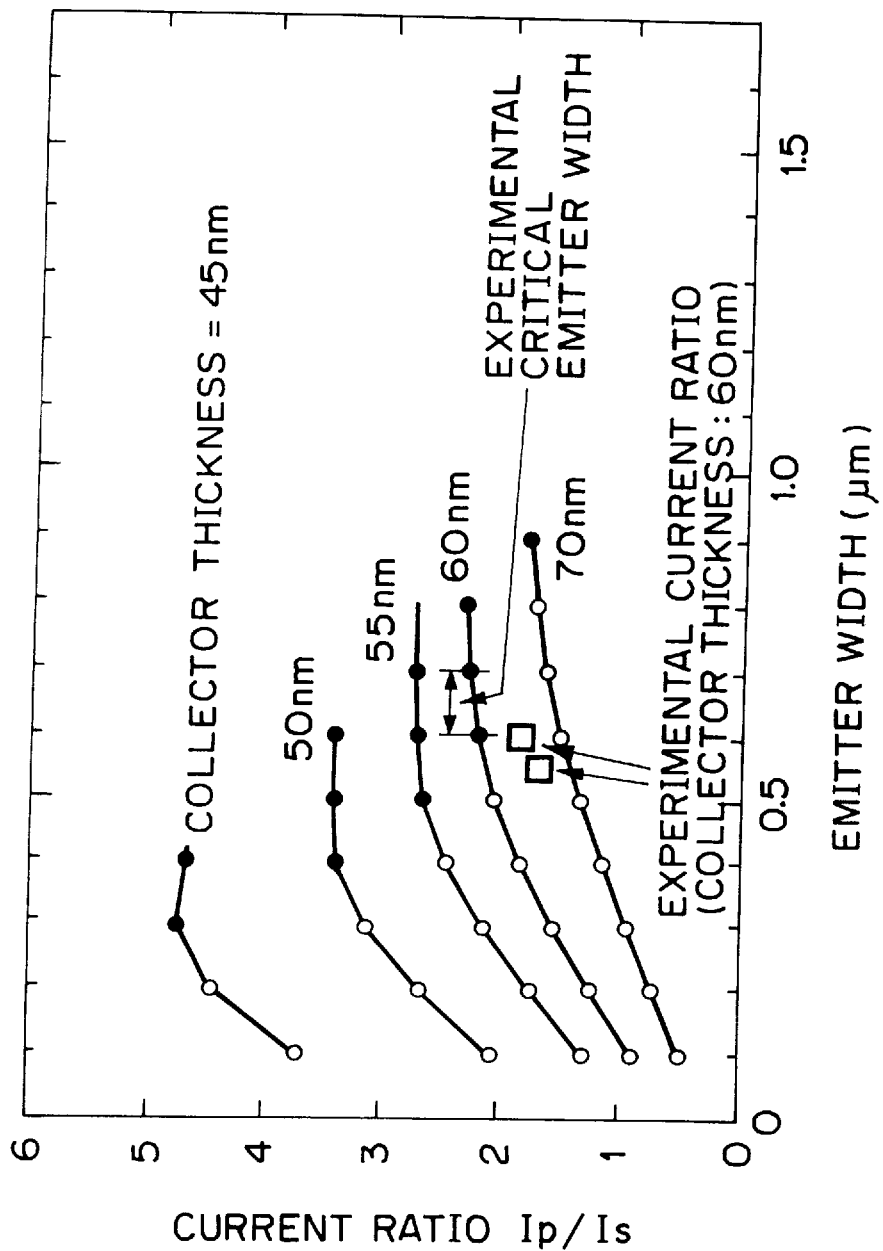
FIG. 10A is a graph illustrating the calculation results of the current ratio vs. emitter width characteristics of the semiconductor functional device according to the present invention.
Figure 10B:
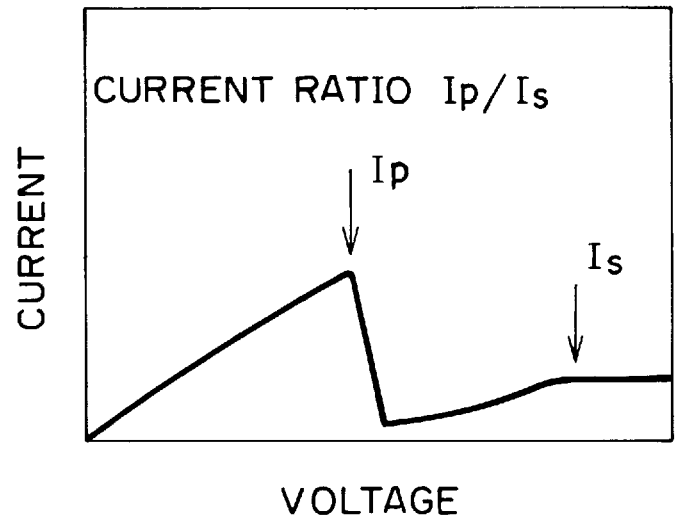
FIGS. 10B and 10C are schematic graphs each illustrating the definition of current ratio used in FIG. 10A.

Referring to FIG. 10A, calculation results are compared with experimental results in order to demonstrate the utility of the calculation results. As an index of comparison is used a current ratio Ip/Is of a peak current Ip to a saturation current Is, in which Ip and Is are defined in FIGS. 10B and 10C. This current ratio, Ip/Is, represents a quality of the single peak I–V characteristics. The larger the ratio is, the better the quality is.

Figure 10C:
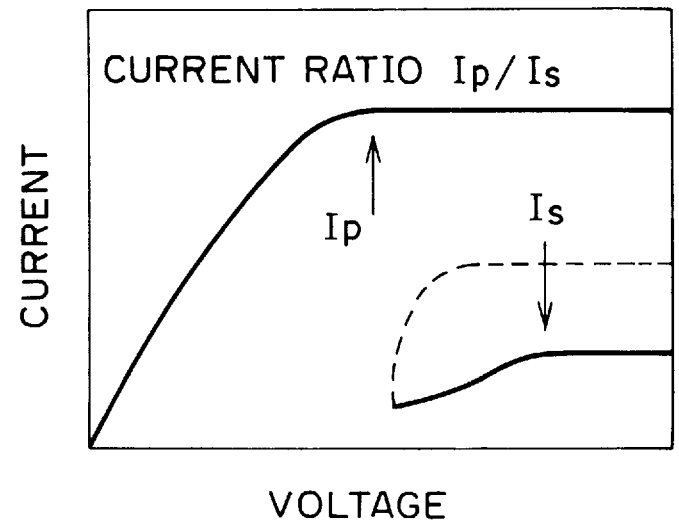

First of all, the calculation results will be explained with reference to FIG. 10A, which graphically shows dependence of the current ratio on the emitter width by using the collector thickness as a parameter. In FIG. 10A, open circles indicate the results of calculation of the current ratio with respect to the single peak I–V characteristics. As described with reference to FIGS. 9A and 9B, when the emitter width is too large, the I–V characteristics are similar to those of a nonlinear resistance with current saturation. Filled circles in FIG. 10A indicate the results of calculation of the current ratio in that case, although definition of the current ratio is changed as illustrated in FIG. 10C. Out of three branches obtained by the calculation in FIG. 10C, only one branch showing the maximum current can be obtained by static measurement. The remaining branches are obtained by calculation. If a critical emitter width is defined as a maximum emitter width in which single peak I–V characteristics can be given with respect to respective collector thicknesses, a calculated value of the critical emitter width is a value between adjacent open and filled circles in FIG. 10A. For example, when the collector thickness is 60 nm, the calculated value of the critical emitter width ranges from 0.5 µm to 0.6 µm.

Next, the experimental results will be explained. Sample devices having emitter widths of 0.55 µm, 0.6 µm and 0.7 µm, respectively, were fabricated with the collector thickness fixed at 60 nm, and respective I–V characteristics of the sample devices were measured. The devices having emitter widths of 0.55 µm and 0.6 µm, respectively, exhibited single peak I–V characteristics. In contrast, the device having an emitter width of 0.7 µm exhibited I–V characteristics similar to those of a nonlinear resistance with current saturation. Thus, it was found from the experiment that the critical emitter width ranges from 0.6 µm to 0.7 µm (a range indicated by a double-headed arrow in FIG. 10A). The measured current ratios of the devices having emitter widths of 0.55 µm and 0.6 µm were 1.7 and 1.8, respectively, as plotted by squares in FIG. 10A.

Referring to FIG. 10A, the calculation results are compared with the experimental results. When the collector thickness is 60 nm, the calculated critical emitter width ranges from 0.5 µm to 0.6 µm. In contrast, the experimental value of critical emitter width ranges from 0.6 µm to 0.7 µm. As a consequence, the calculated critical emitter width is approximately equal to the experimental value. It is inferred from the comparison that the calculated values of the current ratio (indicated by the open circles on the 60 nm line) are approximately the same as the experimental values thereof (indicated by the squares). Consequently, the calculation results substantially reproduce the experimental results.

The calculation results illustrated in FIG. 10A can give a guideline for realizing a semiconductor functional device having single peak I–V characteristics and of a high quality, having a large current ratio. First, in the case where the device has a fixed collector thickness, the larger the emitter width is, the larger the current ratio is. When the emitter width exceeds the critical emitter width, no single peak I–V characteristics of the device can be achieved. Second, the smaller the collector thickness is, the larger the current ratio is. In this case, it is necessary to sufficiently reduce the emitter width. This is because the critical emitter width is smaller when the collector thickness is smaller.

The calculation results given herein are shown by way of example. Values for parameters should not be considered as being absolute, but should be considered as a kind of approximation results. It is fully possible that if more detailed and stricter calculation is performed, slightly different results may be obtained for the details. However, no change of qualitative nature will be needed on the results described herein in spite of such detailed calculations.

The impurity concentration of the n-type InGaAs layer 3, the parameters of the resonant tunneling structure, such as a peak current density, a peak voltage, a valley voltage and a P/V ratio, used in the calculation are shown by way of example. It is to be understood that other parameters can realize the same characteristics and, hence, the present invention is not restricted by these parameters.

Embodiment 1

Figure 11:
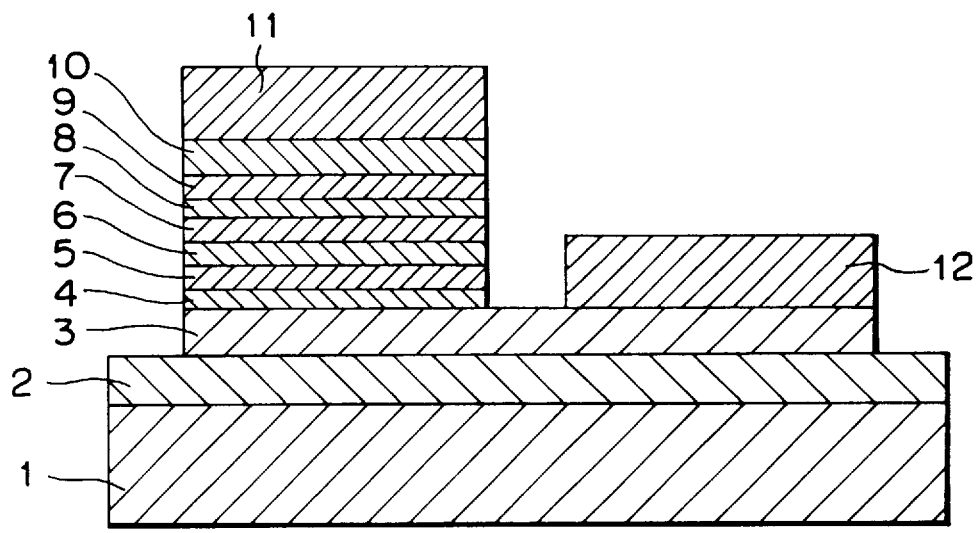
FIG. 11 is a cross-sectional view showing a semiconductor functional device according to a first embodiment of the present invention.

FIG. 11 is a cross-sectional view showing a semiconductor functional device according to a first embodiment of the present invention.

The present invention is basically featured in that the I–V characteristics curve of the device has a single peak and the current at an applied voltage higher than the valley voltage can be suppressed to a value sufficiently smaller than the peak current. By this feature, the present invention is distinguished from the prior art.

Figure 1:
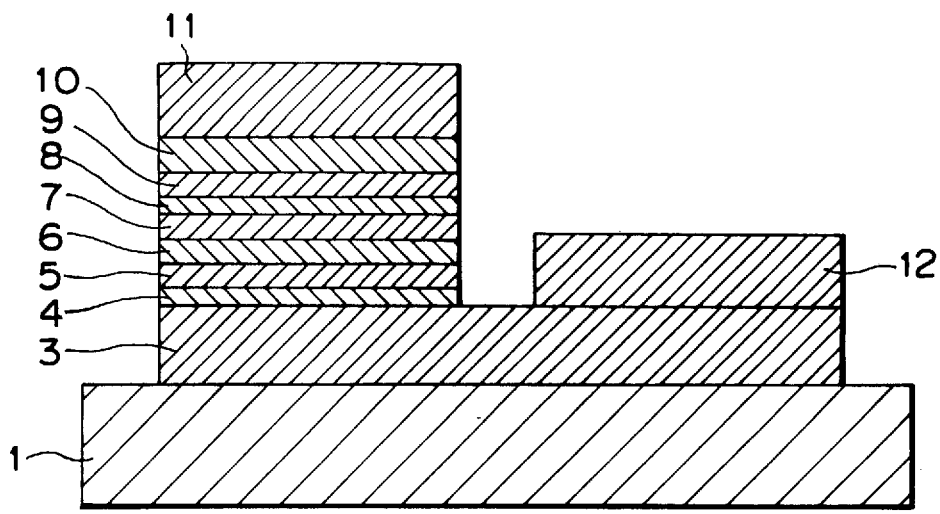
FIG. 1 is a cross-sectional view showing a conventional resonant tunneling device.

The structure of the semiconductor functional device according to the instant embodiment of the present invention shown in FIG. 11 is basically identical to that of the prior art illustrated in FIG. 1 and Table 1 except that the device of the present invention has the following two features:

(1) For a given width of the emitter electrode 11, the thickness and impurity concentration of the n-type InGaAs collector layer 3 are selected such that the collector layer 3 is pinched off at a voltage at which the potential difference between the emitter layer 9 and the collector layer 3 is almost equal to the valley voltage; and (2) the undoped InAlAs layer 2 is inserted between the substrate and the n-type InGaAs collector layer 3.

One example of the semiconductor epitaxial multilayer structure used herein is given below in Table 3. This semiconductor epitaxial multilayer structure can be grown by, e.g., a molecular beam epitaxy method (MBE).

The operational principle of this semiconductor functional device is the same as described hereinabove.

According to the present invention, the thickness and impurity concentration of the collector layer 3 with respect to a width of the emitter electrode 11 of not larger than 3 $\mu$m are set as follows:

Thickness: not greater than 300 nm

Impurity concentration: not higher than $5 \times 10^{18}$ cm$^{-3}$.

Embodiment 2

Figure 12:
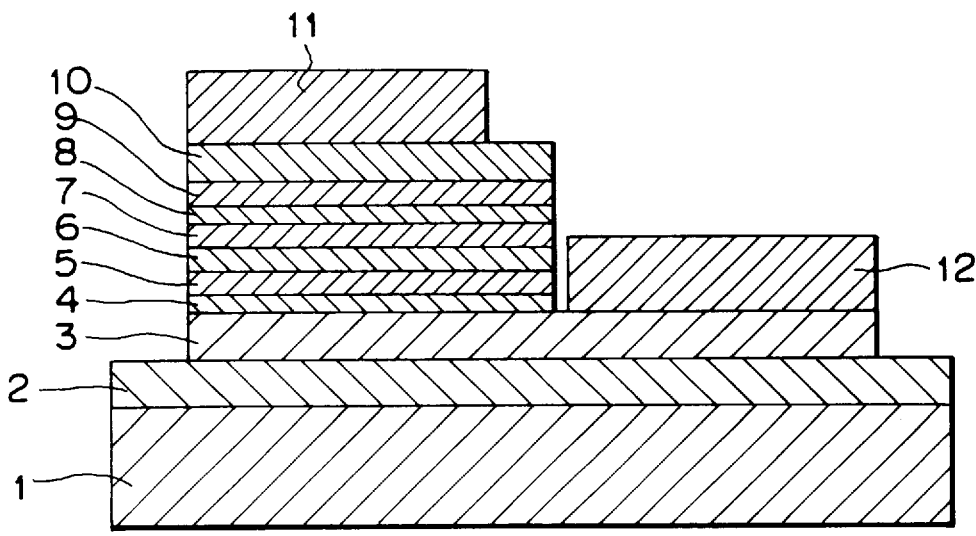
FIG. 12 is a cross-sectional view showing a semiconductor functional device according to a second embodiment of the present invention.

FIG. 12 is a cross-sectional view showing a semiconductor functional device according to a second embodiment of the present invention. The second embodiment is identical to the first embodiment except for the following point: While in the first embodiment the layers 10, 9, 8, 7, 6, 5 and 4 are formed only just under the emitter electrode 11, in the second embodiment, the layers 10, 9, 8, 7, 6, 5 and 4 are formed not only just under the emitter electrode 11 but also extend toward the collector electrode 12 with a clearance therefrom, with a portion of the layer 10 being uncovered by the emitter electrode 11. In other words, the layers 10, 9, 8, 7, 6, 5 and 4 are projected from under the emitter electrode 11 toward the collector electrode 12 but with a clearance therefrom. In this embodiment, the emitter electrode 11 may be deemed substantially as wide as the layers 10, 9, 8, 7, 6, 5 and 4. This is because the potentials of the layers 10 and 9 not just under the emitter electrode 11 (i.e., not covered by the emitter electrode 11) can be considered to be equal to those of the layers 10 and 9 just under the emitter electrode 11 since a sufficiently small resistance is selected for each of the layers 10 and 9. The feature of this second embodiment is that the distance between the emitter electrode 11 and the collector electrode 12 is substantially shorter than that in the first embodiment, so that the parasitic resistance generated between the electrodes 11 and 12 can be reduced further.

Embodiment 3

Figure 13:
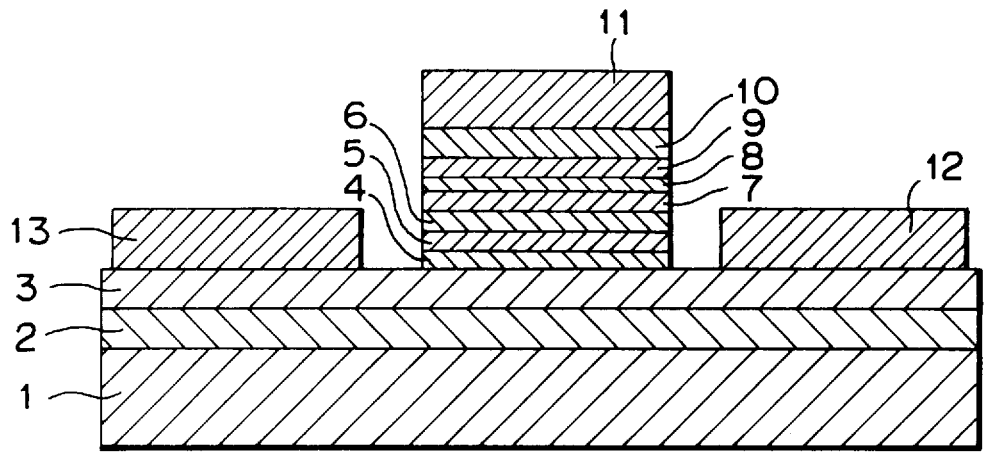
FIG. 13 is a cross-sectional view showing a semiconductor functional device according to a third embodiment of the present invention.

FIG. 13 is a cross-sectional view showing a semiconductor functional device according to a third embodiment of the present invention. This embodiment is different from the first embodiment only in that collector electrodes 12 and 13 are provided on both sides of an emitter electrode 11. The feature of the semiconductor functional device according to this third embodiment is that owing to the structural symmetry of the device, electrons travel from the emitter electrode 11 toward both the collector electrode 12 on the right side and the collector electrode 13 on the left side in FIG. 13. A potential/current distribution on the right side is identical

TABLE 3

| LAYER No. | LAYER NAME | n-TYPE IMPURITY CONCENTRATION (/cm$^3$) | MATERIAL | THICKNESS (nm) |
|---|---|---|---|---|
| 10 | CAP | $1 \times 10^{19}$ | InGaAs | 30 |
| 9 | EMITTER | $1 \times 10^{18}$ | InGaAs | 120 |
| 8 | SPACER | UNDOPED | InGaAs | 1.4 |
| 7 | BARRIER | UNDOPED | AlAs | 2 |
| 6 | WELL | UNDOPED | InGaAs | 4.1 |
| 5 | BARRIER | UNDOPED | AlAs | 2 |
| 4 | SPACER | UNDOPED | InGaAs | 3 |
| 3 | COLLECTOR | $1 \times 10^{18}$ | InGaAs | 60 |
| 2 | BARRIER | UNDOPED | InAlAs | 200 |
| 1 | SUBSTRATE | — | SEMI-INSULATING InP | — | to that in the case in which the width of the emitter electrode 11 in the first embodiment shown in FIG. 11 is halved. Thus, the right side of the device according to this embodiment can realize a semiconductor functional device having the same I–V characteristics as those in the case in which the width of the emitter electrode 11 in the first embodiment is halved. Consequently, the current flowing in this embodiment is double of that in the first embodiment with a halved emitter width. As described in reference to FIGS. 9A and 9B, it is necessary to sufficiently reduce the width of the emitter electrode 11 in order to achieve excellent single peak I–V characteristics according to the present invention. This embodiment is featured in that a semiconductor functional device whose emitter electrode has a substantial width that is substantially small can be fabricated with ease.

Embodiment 4

Figure 14:
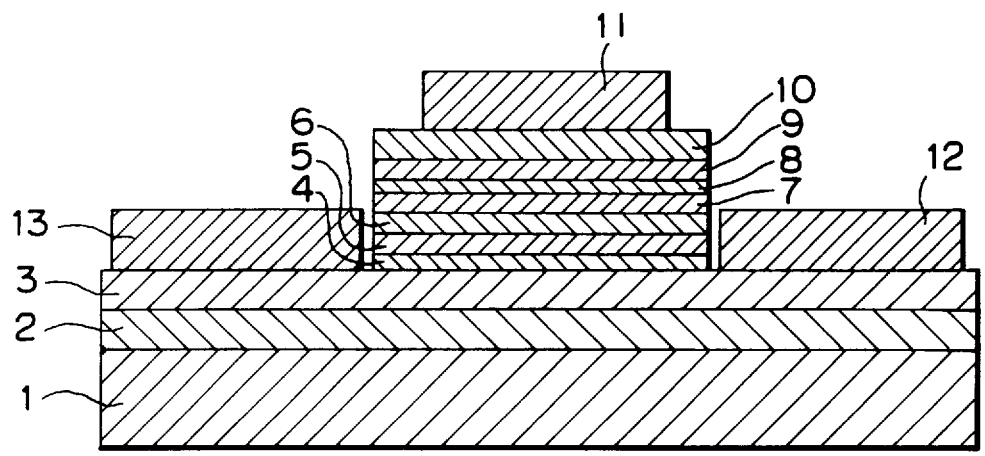
FIG. 14 is a cross-sectional view showing a semiconductor functional device according to a fourth embodiment of the present invention.

FIG. 14 is a cross-sectional view showing a semiconductor functional device according to a fourth embodiment of the present invention. This embodiment is identical to the third embodiment except for one point which follows: While in the third embodiment the layers 10, 9, 8, 7, 6, 5 and 4 are formed only just under the emitter electrode 11, in this fourth embodiment the layers 10, 9, 8, 7, 6, 5 and 4 are formed not only just under the emitter electrode 11 but also extend toward the collector electrodes 12 and 13 with a clearance therefrom, with the layer 10 being uncovered by the emitter electrode 11 at both side portions thereof, in such a manner that the layers 10, 9, 8, 7, 6, 5 and 4 are projected toward the collector electrodes 12 and 13 with a clearance therebetween. In this embodiment, the emitter electrode 11 can be deemed substantially as wide as the layers 10, 9, 8, 7, 6, 5 and 4. This is because the potentials of the layers 10 and 9 not just under the emitter electrode 11 (i.e., not covered by the emitter electrode 11) can be considered to be equal to those of the layers 10 and 9 just under the emitter electrode 11 since a small resistance is selected for each of the layers 10 and 9. The feature of the semiconductor functional device according to this fourth embodiment is that the parasitic resistance of the device can be reduced for the same reason as described in the second embodiment.

In the first to fourth embodiments described above, the layers 10, 8 and 4 are not indispensable. Even without these layers, the devices according to the present invention can be operated in principle. Thus, embodiments in which any or all of these layers are omitted also fall within the scope of the present invention. In the first to fourth embodiments, the layer 10 is provided for the improvement of ohmic contact with the emitter electrode 11, and the layers 8 and 4 are disposed for the usefulness in fabricating the resonant tunneling structure with high reproducibility.

Embodiment 5

Figure 15:
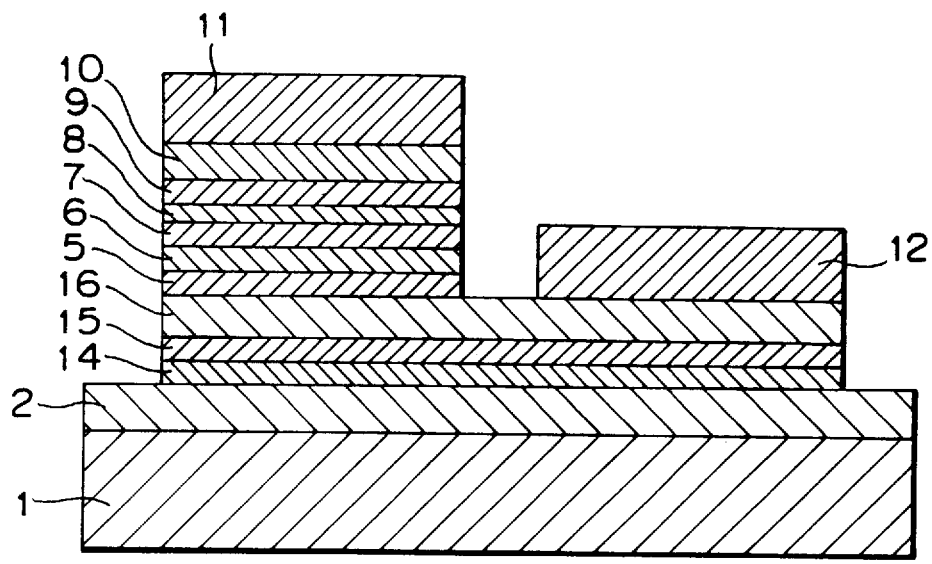
FIG. 15 is a cross-sectional view showing a semiconductor functional device according to a fifth embodiment of the present invention.

FIG. 15 is a cross sectional view showing a semiconductor functional device according to a fifth embodiment of the present invention. This fifth embodiment is identical to the first embodiment except for the following points: The undoped InGaAs layer 4 is omitted, the n-type InGaAs layer 3 is replaced by an undoped InGaAs layer 16, and an n-type InAlAs layer 14 and an undoped InAlAs layer 15 are inserted between the undoped InGaAs layer 16 and the undoped InAlAs layer 2.

In this embodiment, in an inverted high electron mobility transistor (hereinafter abbreviated to "HEMT") structure constituted of the n-type InAlAs layer 14, the undoped InAlAs barrier layer 15 and the undoped InGaAs layer 16 grown on the undoped InAlAs layer 2, 2-dimensional electron gas is accumulated inside the undoped InGaAs layer 16 so as to carry a current which flows in the lateral direction in the undoped InGaAs layer 16. Namely, the 2-dimensional electron gas acts in the same manner as the electrons in the n-type InGaAs layer 3 in the semiconductor functional device according to the first embodiment.

The operational principle of the semiconductor functional device according to this fifth embodiment is essentially identical to that of the device according to the first embodiment. In this embodiment, the thickness and impurity concentration of the n-type InAlAs layer 14 are set as follows: For a given width of the emitter electrode 11, the thickness and impurity concentration of the n-type semiconductor barrier layer 14 in the inverted HEMT structure are selected such that the undoped semiconductor channel layer 16 containing the 2-dimensional electron gas in the inverted HEMT structure (more particularly, the 2-dimensional electron gas layer accumulated in the undoped semiconductor layer 16) is pinched off when the potential difference between the emitter cap layer 10 or emitter layer 9 and the undoped semiconductor channel layer 16 containing the 2-dimensional electron gas in the inverted HEMT structure (more particularly, the 2-dimensional electron gas layer accumulated in the undoped semiconductor channel layer 16) is equal to the valley voltage of the I–V characteristics of the resonant tunneling structure constituted between the emitter cap layer 10 or emitter layer 9 and the undoped semiconductor channel layer 16 containing the 2-dimensional electron gas in the inverted HEMT structure while electrons travel from the emitter electrode 11 toward the collector electrode 12 through the emitter cap layer 10, the emitter layer 9, the epitaxial multilayer structure formed of the layers 8 to 5 and the undoped semiconductor channel layer 16 containing the 2-dimensional electron gas in the inverted HEMT structure.

For example, the thicknesses of the n-type InAlAs layer 14, the undoped InAlAs barrier layer 15 and the undoped InGaAs layer 16 are 20 nm, 2 nm and 15 nm, respectively, and an impurity concentration of the n-type InAlAs layer 14 is $2 \times 10^{18}/cm^3$.

The feature of the semiconductor functional device according to this fifth embodiment is that the device has a parasitic resistance lower than that in the device according to the first embodiment since the 2-dimensional electron gas in the undoped InGaAs layer 16 has a mobility higher than that of the electrons in the n-type InGaAs layer 3 of the device according to the first embodiment.

In the same fashion as in the second, third and fourth embodiments, which are derived from the first embodiment, similar further embodiments may be derived from the fifth embodiment that correspond to the second, third and fourth embodiments. Additionally, also in this case, the thickness and impurity concentration of the n-type semiconductor layer in the inverted HEMT structure for a given width of the emitter electrode of not larger than 3 μm are set as follows:

Thickness: not greater than 300 nm

Impurity concentration: not higher than $5 \times 10^{18}$ cm$^{-3}$.

It is understood that these embodiments fall within the scope of the present invention.

Although the layers are made of InGaAs/InAlAs/AlAs-based materials in the aforementioned embodiments, the same characteristics can be realized by the use of GaAs/AlGaAs/AlAs-based materials by replacing InGaAs and InAlAs by GaAs and AlGaAs, respectively. This case, of course, falls within the scope of the present invention.

Furthermore, although the n-type semiconductor layer has been dealt with in the above-described embodiments, the same effects may be produced in a different conduction type by replacing the n-type and the electrons in the above description with a p-type and holes, respectively.

Embodiment 6

Figure 16:
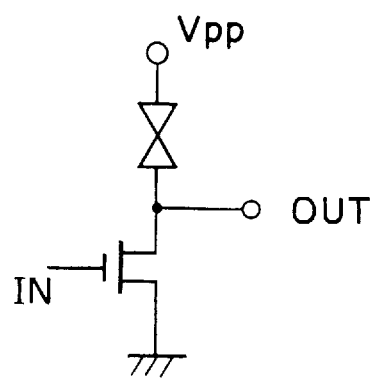
FIG. 16 is a circuit diagram illustrating an inverter circuit provided with a semiconductor functional device structure according to an embodiment of the present invention.

FIG. 16 is a circuit diagram illustrating an inverter circuit provided with the semiconductor functional device structure according to any of Embodiments 1 to 5 above of the present invention. This circuit can provide an inversion signal. The circuit is operated with a large operation allowance at a low electric power.

The present invention has been described in detail with respect to the preferred embodiments, and it will now be apparent from the foregoing description to those skilled in the art that changes and modifications may be made without departing from the invention in its broader aspects, and it is the intention, therefore, in the appended claims to cover all such changes and modifications as fall within the true spirit of the invention.

What is claimed is:

1. A semiconductor functional device comprising:
a semi-insulating semiconductor substrate;
an undoped semiconductor barrier layer provided on said substrate;
a resonant tunneling structure provided on a main surface of said substrate, said resonant tunneling structure having:
a part of an n-type collector layer provided on said barrier layer;
an epitaxial multilayer structure provided on said part of said n-type collector, said epitaxial multilayer including a double barrier structure constituted of a plurality of barrier layers and at least one well layer inserted between any adjacent two of said plurality of barrier layers, and
an n-type emitter layer provided on said epitaxial multilayer structure;
an emitter electrode provided on said emitter layer; and
a collector electrode provided on the remaining part of said collector layer;
wherein for a given width of said emitter electrode, a thickness and an impurity concentration of said collector layer are selected such that said collector layer is pinched off, when a potential difference between said emitter layer and said collector layer established while electrons travel from said emitter electrode toward said collector electrode through said emitter layer, said epitaxial multilayer structure and said collector layer is equal to a valley voltage of I–V characteristics of said resonant tunneling structure.

2. The semiconductor functional device as claimed in claim 1, wherein said collector layer has a thickness of not greater than 300 nm and an impurity concentration of not higher than $5 \times 10^{18}$ cm$^{-3}$ for a given width of said emitter electrode of not larger than 3 $\mu$m.

3. The semiconductor functional device as claimed in claim 1, wherein said undoped semiconductor barrier layer consists of InAlAs, said collector layer consists of InGaAs, said plurality of barrier layers consist of AlAs, said well layer inserted in any adjacent two of said barrier layers consists of InGaAs, and said emitter layer consists of InGaAs.

4. The semiconductor functional device as claimed in claim 1, wherein said undoped semiconductor barrier layer consists of AlGaAs, said collector layer consists of GaAs, said plurality of barrier layers consist of AlAs, said well layer inserted in any adjacent two of said barrier layers consists of GaAs, and said emitter layer consists of GaAs.

5. The semiconductor functional device as claimed in claim 1, wherein said epitaxial multilayer structure including said double barrier structure is not only formed just under said emitter electrode but also projected toward said collector electrode with a clearance therefrom.

6. The semiconductor functional device as claimed in claim 1, wherein said collector electrode comprises first and second collector electrodes provided on one and the other sides, respectively, of said epitaxial multilayer structure with a clearance therefrom.

7. The semiconductor functional device as claimed in claim 5, wherein said collector electrode comprises first and second collector layers provided on one and the other sides, respectively, of said epitaxial multilayer structure with a clearance therefrom.

8. A semiconductor functional device comprising:
a semi-insulating semiconductor substrate;
a first undoped semiconductor barrier layer provided on said substrate;
an inverted high electron mobility transistor structure provided on said first undoped semiconductor barrier layer, having:
an n-type semiconductor barrier layer provided on the first undoped semiconductor barrier layer,
a second undoped semiconductor barrier layer provided on the n-type semiconductor barrier layer, and
an undoped semiconductor channel layer provided on the second undoped semiconductor barrier layer:
a resonant tunneling structure, the resonant tunneling structure having:
an epitaxial multilayer structure provided on the undoped semiconductor channel layer, having a double barrier structure constituted of a plurality of barrier layers and at least one well layer inserted between any adjacent two of the plurality of barrier layers;
an n-type emitter layer provided on the epitaxial multilayer structure;
an emitter electrode provided on the emitter layer; and
a collector electrode provided on the undoped semiconductor channel layer;
wherein for a given width of said emitter electrode, a thickness and an impurity concentration of said n-type semiconductor barrier layer in said inverted high electron mobility transistor structure are selected such that said undoped semiconductor channel layer containing 2-dimensional electron gas in said inverted high electron mobility transistor structure is pinched off when a potential difference between said emitter layer and said undoped semiconductor channel layer containing the 2-dimensional electron gas in said inverted high electron mobility transistor structure established while electrons travel from said emitter electrode toward said collector electrode through said emitter layer, said epitaxial multilayer structure and said undoped semiconductor channel layer containing the 2-dimensional electron gas in said inverted high electron mobility transistor structure is equal to a valley voltage of I–V characteristics of said resonant tunneling structure constituted between said emitter layer and said undoped semiconductor channel containing the 2-dimensional electron gas in said inverted high electron mobility transistor structure.

9. The semiconductor functional device as claimed in claim 8, wherein said n-type semiconductor barrier layer in said inverted high electron mobility structure has a thickness of not greater than 300 nm and an impurity concentration of not higher than $5\times10^{18}$ cm$^{-3}$ for a width of said emitter electrode of not larger than 3 µm.

10. The semiconductor functional device as claimed in claim 8, wherein said first undoped semiconductor barrier layer consists of InAlAs, said n-type semiconductor barrier layer consists of InAlAs, said second undoped semiconductor barrier layer consists of InAlAs, and said undoped semiconductor channel layer in said inverted high electron mobility transistor structure consists of InGaAs, said plurality of barrier layers consist of AlAs, said at least one well layer inserted between any adjacent two of said barrier layers consists of InGaAs, and said emitter layer consists of InGaAs.

11. The semiconductor functional device as claimed in claim 8, wherein said first undoped semiconductor barrier layer consists of AlGaAs, said n-type semiconductor barrier layer consists of AlGaAs, said second undoped semiconductor barrier layer consists of AlGaAs, and said undoped semiconductor channel layer in said inverted high electron mobility transistor structure consists of GaAs, said plurality of barrier layers consist of AlAs, said at least one well layer inserted between any adjacent two of said barrier layers consists of GaAs, and said emitter layer consists of GaAs.

12. The semiconductor functional device as claimed in claim 8, wherein said epitaxial multilayer structure including said double barrier structure is not only formed just under said emitter electrode but also projected toward said collector electrode with a clearance therefrom.

13. The semiconductor functional device as claimed in claim 12, wherein said collector electrode comprises first and second collector electrodes provided on one and the other sides, respectively, of said epitaxial multilayer structure with a clearance therefrom.

14. An electronic circuit comprising said semiconductor functional device as claimed in claim 1.

15. An electronic circuit comprising said semiconductor functional device as claimed in claim 8.

16. A semiconductor device, comprising:

a substrate;

a barrier layer on the substrate;

a collector layer on the barrier layer;

an epitaxial multilayer structure on a first portion of the collector layer, the epitaxial multilayer structure including a pair of further barrier layers and a well layer between the further barrier layers;

an emitter layer on the epitaxial multilayer structure;

an emitter electrode on the emitter layer; and a collector electrode on a second portion of the collector layer, adjacent the epitaxial multilayer structure;

wherein the emitter layer, the epitaxial multilayer structure, and the first portion of the collector layer cooperate to provide a resonant tunneling structure having I–V characteristics with a valley voltage, and wherein for a given width of the emitter electrode, the collector layer has a thickness and an impurity concentration that are selected so that the collector layer is pinched off when a potential difference applied between the collector and emitter electrodes is approximately equal to the valley voltage.

17. The semiconductor device as claimed in claim 16, wherein the substrate consists essentially of semi-insulating semiconductor material, wherein the barrier layer on the substrate consists essentially of undoped semiconductor material, wherein the collector and emitter layers are n-type layers.

18. The semiconductor device as claimed in claim 16, wherein the collector layer has a thickness of not greater than 300 nm and an impurity concentration of not higher than $5\times10^{18}$ cm$^{-3}$ for a given width of the emitter layer of not larger than about 3 µm.

19. A semiconductor device, comprising:

a substrate;

an undoped barrier layer on the substrate;

an inverted high electron mobility transistor structure on the barrier layer, the inverted high electron mobility transistor including a doped barrier layer on the undoped barrier layer, an undoped barrier layer on the doped barrier layer, and an undoped channel layer on the undoped barrier layer;

an epitaxial multilayer structure on a first portion of the channel layer, the epitaxial multilayer structure including a pair of further barrier layers and a well layer between the further barrier layers;

an emitter layer on the epitaxial multilayer structure;

an emitter electrode on the emitter layer; and a collector electrode on a second portion of the channel layer, adjacent the epitaxial multilayer structure, wherein the emitter layer, the epitaxial multilayer structure, and the channel layer cooperate to provide a resonant tunneling structure having I–V characteristics with a valley voltage, and wherein for a given width of the emitter electrode, the doped barrier layer of the inverted high electron mobility transistor structure has a thickness and an impurity concentration that are selected so that the channel layer of the inverted high electron mobility transistor structure is pinched off when a potential difference applied between the collector and emitter electrodes is approximately equal to the valley voltage.

20. The semiconductor device as claimed in claim 19, wherein the substrate consists essentially of semi-insulating semiconductor material, when the doped barrier layer of the inverted high electron mobility structure is an n-type layer, and wherein the emitter layer is an n-type layer.

21. The semiconductor device as claimed in claim 19, wherein the doped barrier layer of the inverted high electron mobility transistor structure has a thickness of not greater than 300 nm and an impurity concentration of not higher than $5\times10^{18}$ cm$^{-3}$ for a width of the emitter electrode of not larger than 3 µm.

* * * * *